United States Patent
Kim

(10) Patent No.: US 7,936,195 B2
(45) Date of Patent: May 3, 2011

(54) WIDEBAND DELAY-LOCKED LOOP (DLL) CIRCUIT

(75) Inventor: Jun-bae Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/582,088

(22) Filed: Oct. 20, 2009

(65) Prior Publication Data

US 2010/0102860 A1    Apr. 29, 2010

(30) Foreign Application Priority Data

Oct. 23, 2008    (KR) ........................ 10-2008-0104259

(51) Int. Cl.
*H03L 7/06* (2006.01)

(52) U.S. Cl. ........................................ 327/158; 327/149

(58) Field of Classification Search .................. 327/149, 327/158

See application file for complete search history.

(56) References Cited

U.S. PATENT DOCUMENTS

| 7,327,176 B2* | 2/2008 | Takai et al. .................... 327/158 |
| 7,812,654 B2* | 10/2010 | Kim et al. ...................... 327/158 |
| 7,830,189 B2* | 11/2010 | Abe ............................... 327/158 |
| 7,839,191 B2* | 11/2010 | Takai ............................ 327/158 |
| 2008/0100356 A1* | 5/2008 | Lee ............................... 327/158 |
| 2010/0182058 A1* | 7/2010 | Gomm ........................... 327/158 |
| 2010/0226188 A1* | 9/2010 | Kim et al. ...................... 365/194 |

FOREIGN PATENT DOCUMENTS

| KR | 1020030056461 A | 7/2003 |
| KR | 1020040102641 A | 12/2004 |
| KR | 1020060084275 A | 7/2006 |

* cited by examiner

*Primary Examiner* — Lincoln Donovan
*Assistant Examiner* — Adam D Houston
(74) *Attorney, Agent, or Firm* — Volentine & Whitt, PLLC

(57) ABSTRACT

A wideband delay-locked loop (DLL) circuit includes an internal clock signal generating unit providing an internal control signal by selecting and interpolating between two clock delay signals during a primary phase locking operation. The internal clock signal may be modified by a secondary phase locking operation if more delay is required to phase lock the internal clock signal to an external clock signal. A phase detection/control circuit generates various control signals based on a phase comparison of the internal clock signal and the external clock signal.

16 Claims, 2 Drawing Sheets

WIDEBAND DELAY-LOCKED LOOP (DLL) CIRCUIT

CROSS-REFERENCE TO RELATED APPLICATIONS

This application claims the benefit of Korean Patent Application No. 10-2008-0104259 filed on Oct. 23, 2008, the subject matter of which is hereby incorporated by reference.

BACKGROUND

The inventive concept relates to a delay-locked loop (DLL) circuit, and more particularly to a wideband DLL circuit that is used to synchronize not only phases of a high-frequency clock signal and an internal clock signal, but also phases of a low frequency clock signal and an internal clock signal.

DLL circuits are commonly used to synchronize clock signals applied to integrated circuit devices, such as memory devices and signal processing devices. In certain applications, a DLL circuit may be used to drop the frequency of a clock signal into a lower frequency band to reduce power consumption. Such specific applications notwithstanding, DLL circuits are generally used within dynamic random access memory (DRAM) while operating across a wide frequency range.

The operative frequency range of a DLL circuit (i.e., the range of frequencies across which the DLL circuit may successfully "lock" a target signal) is determined to a great extent by the sum of a "delay block" delay time and a "clock path" delay time. The delay block delay time is a variable delay defined by a conventionally understood delay block included in the DLL circuit. The clock path delay time is a delay defined by the load being driven by a clock signal generated by the DLL circuit.

A delay block within a DLL circuit generally includes a plurality of serially connected delay cells that function to delay an input clock signal for a predetermined delay time. In this regard, the respective delays provided by each of the plurality of series connected delay cells are typically the same length. Since each clock path delay time varies according to the type and/or the number of loads driven by a corresponding clock signal provided by the DLL circuit, it is necessary to carefully consider the clock path delay time whenever a DLL circuit is designed.

A DLL circuit typically generates "an internal clock signal" (i.e., a clock signal generated by the DLL circuit) by first applying a delay block delay time and a clock path delay time to "an external clock signal" (i.e., a clock signal provided from a source external to the DLL circuit), and then comparing the phase of the internal clock signal with the phase of the external clock signal. The DLL circuit may compare these two phases by varying the delay block delay time. When the phases of the internal clock signal and external clock signal are synchronized within a defined error range, the DLL circuit locks the delay block delay time and may then perform more finely tuned phase locking.

A "unit delay time" (i.e., the delay time provided by each of the plurality of series connected delay cells forming the delay block of a DLL circuit) will vary according to whether the DLL circuit is used to synchronize the phase of a relatively high frequency clock signal with the internal clock signal, or whether the DLL circuit is used to synchronize the phase of a relatively low frequency clock signal and the internal clock signal. (Hereafter, the terms "high frequency clock signal" and "low frequency clock signal" are used in a relative relationship. That is, the operating frequency of the high frequency clock signal is higher than the frequency of a low frequency clock signal). Thus, in order for a DLL circuit to accurately synchronize the phases of a high frequency clock signal and an internal clock signal, the unit delay time must be relatively small. Whereas, the DLL circuit may accurately synchronize the phases of the low frequency clock signal and internal clock signal using a relatively larger unit delay time.

SUMMARY

In one embodiment, the inventive concept provides a wideband delay-locked loop (DLL) circuit, comprising; an internal clock signal generating unit comprising, a primary delay block receiving an external clock signal and comprising a plurality of series connected delays cells each respectively providing a clock delay signal, such that a plurality of clock delay signals ranging from a zero clock delay signal up through an Nth clock delay signal is provided, where "N" is a positive integer greater than 1, a switching block selecting two of the plurality of clock delay signals and providing the selected two clock delay signals as first and second switching clock signals, and an interpolator receiving and interpolating between the first and second switching clock signals to generate a zero internal clock signal. The wideband delay-locked loop (DLL) circuit also comprises; a path selecting switch receiving the internal clock signal and either (1) passing the zero internal clock signal to generate an internal clock signal or (2) applying the zero internal clock signal to a secondary delay block providing a secondary delay time to the zero internal clock signal to generate the internal clock signal, a clock path delay block receiving the internal clock signal and applying a clock path delay time to the internal clock signal to generate a first internal clock signal, and a phase detection/ control circuit receiving and comparing a phase of the first internal clock signal with a phase of the external clock signal, and generating an interpolation control signal controlling the interpolator, a multi-switch control signal controlling the switching block, and a path switch control signal controlling the path selecting switch.

In another embodiment, the inventive concept provides a wideband delay-locked loop (DLL) circuit comprising the above an internal clock signal generating unit, as well as a path selecting switch receiving the internal clock signal and either (1) passing the zero internal clock signal to generate an internal clock signal or (2) applying the zero internal clock signal to a secondary delay block providing a secondary delay time to the zero internal clock signal to generate the internal clock signal, a clock path delay block receiving the internal clock signal and applying a clock path delay time to the internal clock signal to generate a first internal clock signal, a phase detection/control circuit receiving and comparing a phase of the first internal clock signal with a phase of the external clock signal, and generating an interpolation control signal controlling the interpolator, a multi-switch control signal controlling the switching block, and a reset control signal, and a secondary delay block control circuit receiving the reset control signal and generating a reset signal and a path switch control signal controlling the path selecting switch.

BRIEF DESCRIPTION OF THE DRAWINGS

Embodiments of the inventive concept will be described with reference to the accompanying drawings in which.

DESCRIPTION OF EMBODIMENTS

Certain embodiments of the inventive concept will now be described with reference to the accompanying drawings. However, it should be noted that the inventive concept may be variously embodied and is not limited to only the illustrated embodiments. Rather, these embodiments are presented as teaching examples. Throughout the written description and drawings, like reference numbers and labels are used to indicate like and similar elements.

A wideband delay-locked loop (DLL) circuit according to an embodiment of the inventive concept may rapidly lock the phase of a clock signal by applying an additional delay block during a secondary operation of the DLL when the clock signal has not yet been locked, although a phase locking loop using a primary delay block has once been performed. In this manner, DLL circuits according to an embodiment of the inventive concept may rapidly lock not only the phase of a high frequency signal, but also the phase of a low frequency signal relative to an internal clock signal.

Figure 1:
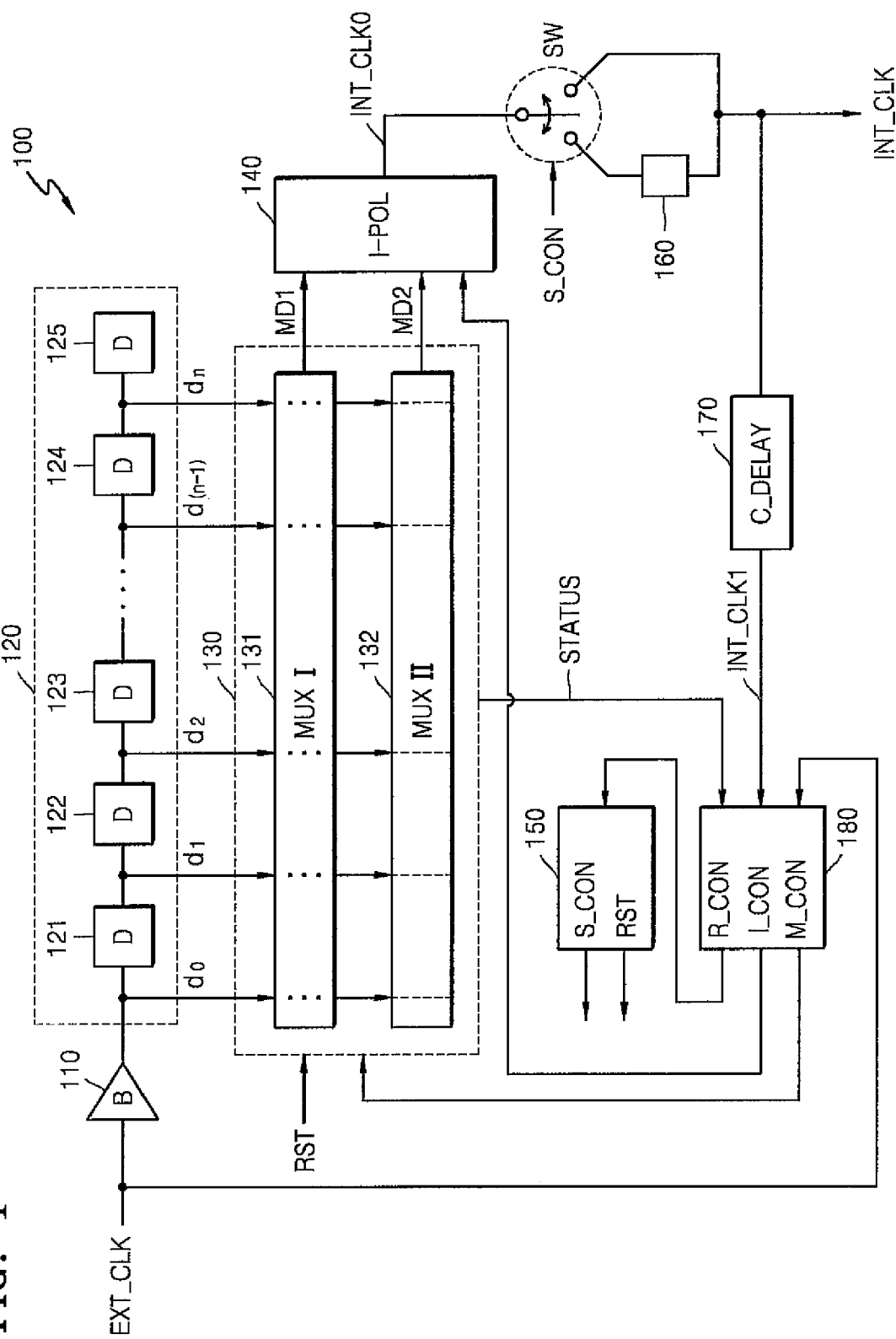
FIG. 1 is a diagram of a wideband delay-locked loop (DLL) circuit according to an embodiment of the inventive concept.

FIG. 1 is a diagram of a wideband DLL circuit 100 according to an embodiment of the inventive concept.

Referring to FIG. 1, the wideband DLL circuit 100 comprises a buffer 110, a primary delay block 120, a switching block 130, an interpolator 140, a secondary delay block control circuit 150, a secondary delay block 160, a clock path delay block 170, a phase detection/control circuit 180, and a path selecting switch SW.

The buffer 110 receives and buffers an external clock signal (EXT_CLK).

In the embodiment of the inventive concept illustrated in FIG. 1, the primary delay block 120 comprises a plurality of delay cells 121 through 125, each respectively generating a plurality of delay clock signals $d_1$ through $d_n$ by sequentially delaying the buffered external clock signal by a defined unit delay time. In the illustrated embodiment, the applied external clock signal is delayed "n" times, where n is a positive integer, to provide an "Nth delay clock signal" $d_n$ delaying the external clock signal by n times the unit delay time. Thus, defining the response delay of an output signal with respect to an input signal to a random delay cell selected from among the plurality of delay cells 121 through 125 is a function of the unit delay time, and in the illustrated embodiment of FIG. 1 the respective unit delay times are assumed to be equal for each one of the delays cells 121 through 125. Under this assumption, the delay between any two "sequential" delay clock signals is the unit delay time. Hereafter, the term "a sequential delay clock signal" is used to denote a delay clock signal generated by an adjacent delay cell in the primary delay block 120, or the term "sequential delay clock signals" is used to denote respective delay clock signals derived from adjacent delay cells in the primary delay block 120. Further, a "zero delay clock signal" $d_0$ is defined as the buffered external clock signal in the illustrated embodiment of FIG. 1.

The switching block 130 selects two sequential delay clock signals from among the plurality of delay clock signals $d_1$ through $d_n$, in response to a reset signal (RST) and a multi-switch control signal (M_CON). In response, the switching block 130 provides the two sequential delay clock signals as a first switching clock signal (MD1) and a second switching clock signal (MD2), and then provides a switch status signal (STATUS) including, for example, information regarding a selected delay clock signals (i.e., status of the switching block in its selection process). Since the first and second switching clock signals are generated by switching to two sequential delay clock signals, the first and second switching clock signals have a phase difference equal to the unit delay time.

In the embodiment illustrated in FIG. 1, the switching block 130 comprises a first multiplexer (MUX I) 131 and a second multiplexer (MUX II) 132 to accomplish the foregoing signal switching operation.

The multi-switch control signal indicates which delay clock signal is to be selected from among the plurality of delay clock signals 121 to 125 by the first multiplexer 131 and the second multiplexer 132. Thus, assuming that the first multiplexer 131 selects a random delay clock signal, the multi-switch control signal will control the second multiplexer 132 to select a delay clock signal that is faster or slower by the unit delay time than the randomly selected delay clock signal. Thus, the first switching clock signal may be selected by the first multiplexer 131 and the second switching clock signal may be selected by the second multiplexer 132 thereafter with respect to the first switching clock signal.

The reset signal initializes the first multiplexer 131 and second multiplexer 132. In initializing the first multiplexer 131 and second multiplexer 132, the first multiplexer 131 and the second multiplexer 132 are controlled to select (e.g.,) the zero delay clock signal $d_0$ and the first delay clock signal $d_1$, respectively. The interpolator 140 then interpolates the first and second switching clock signals in response to an interpolation control signal (I_CON), to thereby generate a zero internal clock signal (INT_CLK0). The delay time of the zero internal clock signal is defined by the interpolation between the first and second switching clock signals.

The path selecting switch SW connects the zero internal clock signal to either the additional delay block 160 or the clock path delay block 170 in response to a path switch control signal (S_CON).

The secondary delay block control circuit 150 generates the reset signal and the path switch control signal in response to a reset control signal (R_CON). When the reset control signal is enabled, the reset signal is enabled and the path switch control signal is changed to control the path selecting switch SW to deliver the zero internal clock signal to the secondary delay block 160.

With this set of control signal defined connections, the secondary delay block 160 provides the internal clock signal (INT_CLK) by additionally delaying the zero internal clock signal as applied via the path selecting switch SW. Here, the applied "secondary delay time" indicates a response delay time of an output signal to the secondary delay block 160 with respect to an input signal of the secondary delay block 160, and may be selectively determined by a delay component installed in the secondary delay block 160. In certain embodiments of the inventive concept, the secondary delay time will be less than or equal to the total delay time (e.g., "n" times the unit delay time) provided by the primary delay block 120. In consideration of certain conventionally understood process variations in the fabrication of the wideband DLL circuit 100 and in accordance with an embodiment of the inventive concept, the secondary delay time may be set at 80% of the total delay time provided by the primary delay block 120. The delay component used to implement the secondary delay time in secondary delay block 160 may be one or more inverter(s), resistor(s) and capacitor(s), or combination of same.

The clock path delay block 170 generates a first internal clock signal (INT_CLK1) by delaying the internal clock signal by a clock path delay time. According to a selection result by the path selecting switch SW, the internal clock signal will be either the output of the secondary delay block 160 or the zero internal clock signal passed by the path selecting switch SW. Since the clock path delay time varies according to the type and number of load(s) to be driven by the internal clock signal, as provided by the wideband DLL circuit 100, the clock path delay time will vary according to the various application of the wideband DLL circuit 100.

In response to the switch status signal, that is, by referring to a signal indicating which delay clock signals have been selected from among the plurality of delay clock signals $d_1$ to $d_n$ by the first multiplexer 131 and second multiplexer 132, the phase detection/control circuit 180 compares the phase of the external clock signal to the phase of the first internal clock signal, and generates the interpolation control signal, the multi-switch control signal, and the reset control signal.

Before phase locking is performed on the multi-switch control signal used to select the two sequential delay clock signals provided by the primary delay block 120, the interpolation control signal indicates the general (or basic) interpolation, and after the multi-switch control signal is locked, the interpolation control signal indicates fine phase locking.

The multi-switch control signal varies with the value of a delay clock signal to be selected during a phase locking loop until the delay clock signal is locked.

The reset control signal R_CON is enabled according to the switch status signal and results in the comparison between the phases. After the switching block 130 takes a possible maximum delay time, the reset control signal is enabled when the phase of the external clock signal does is not synchronous with the phase of the first internal clock signal even when the switching block 130 selects the (n−1)th delay clock signal $d_{(n-1)}$ and the nth delay clock signal $d_n$.

Consistent with the foregoing functionality description, the external clock signal (EXT_CLK) applied to the wideband DLL circuit 100 is received and buffered by the buffer 110. Then, the buffered external clock signal is provided to the primary delay block 120.

The primary delay block 120 generates the plurality of delay clock signals $d_1$ through $d_n$ by delaying the external clock signal by a unit delay time or by sequentially delaying the external clock signal by "k" times of the unit delay time, where k varies from 2 to n.

During a "primary phase locking operation" performed by the wideband DLL circuit 100, the phase detection/control circuit 180 sets the switching block 130 to select, in response to a multi-switch control signal (M_CON), the zero delay clock signal $d_0$ and the first delay clock signal $d_1$. Once selected, the zero delay clock signal $d_0$ and the first delay clock signal $d_1$ are respectively output as the first switching clock signal (MD1) and the second switching clock signal (MD2).

The interpolator 140 generates a zero internal clock signal (INT_CLK0) by interpolating between the first and second switching clock signals. During this process, the interpolation control signal (I_CON) indicates that the interpolator 140 is currently performing a primary (or general) interpolation. This indication is useful because many conventional interpolators may be used for accurate (i.e., close tolerance) phase locking operations. However, as indicated by the interpolation control signal, the interpolator 140 of the illustrated embodiment may use simple interpolation instead of more complex interpolation during the primary phase locking operation. For example, simple interpolation may be sufficient to allow the zero internal clock signal to have a phase between the phase of the first switching clock signal MD1 and the phase of the second switching clock signal MD2.

The path switch control signal (S_CON) indicates that the path selecting switch SW is providing the zero internal clock signal to the clock path delay block 170 until the reset signal (RST) is enabled.

As the zero internal clock signal is provided to the clock path delay block 170, the clock path delay block 170 generates a first internal clock signal (INT_CLK1) which differs from internal clock signal by a delay equal to the clock path delay time.

The phase detection/control circuit 180 compares the phase of the external clock signal to the phase of the first internal clock signal. As a result of this comparison, if the phases are synchronized, the phase detection/control circuit 180 locks the multi-switch control signal (M_CON) to allow the switching block 130 to constantly output the first and second switching clock signals, and changes a value of the interpolation control signal to indicate the more accurate phase locking operations.

However, if the phases are not synchronized, the phase detection/control circuit 180 changes the value of the multi-switch control signal to cause the switching block 130 to select the first delay clock signal $d_1$ and the second delay clock signal $d_2$ as the first and second switching clock signals. This first and second delay clock signal selection loop continues until the phase of the external clock signal becomes synchronized with the phase of the first internal clock signal INT_CLK1. Thus, the phase detection/control circuit 180 continuously performs phase detection while varying the value of the multi-switch control signal M_CON until the phase of the external clock signal becomes synchronized with the phase of the first internal clock signal INT_CLK1.

However, when the phase of the external clock signal will not synchronize with the phase of the first internal clock signal after running through a maximum number of selection loops (i.e., n−1), or until and when the switching block 130 selects the (n−1)th delay clock signal $d_{(n-1)}$ and the nth delay clock signal $d_n$, the frequency of the external clock signal is determined to exceed the frequency range compatible with the primary delay block 120 of the wideband DLL circuit 100. In other words, the external clock signal is determined to be low frequency external clock signal.

Since the wideband DLL circuit 100 is designed to generate an internal clock signal synchronized with the phase of a high frequency external clock signal, the unit delay time for each one of the plurality of delay cells 121 through 125 in the primary delay block 120 is defined to be relatively short. Thus, when the wideband DLL circuit 100 is operated to generate an internal clock signal synchronized with the phase of a low frequency external clock signal, the total delay time provided by the primary delay block 120 may be insufficient to allow this operation.

In such a case, the secondary delay block control circuit 150 enables the reset signal in response to a reset control signal, and changes the value of the path switch control signal (S_CON) from one indicating that the zero internal clock signal is provided to the clock path delay block 170, to a value indicating that the path selecting switch SW now provides the zero internal clock signal to the clock path delay block 170 via the secondary delay block 160. Thus, in the illustrated embodiment, an enabled reset signal initializes the switching block 130.

As described above, if the phase of the external clock signal will not synchronize with the phase of the first internal clock signal during the primary phase locking operation, a "secondary phase locking operation" will be additionally performed.

During the secondary phase locking operation, the path switch control signal is set such that the path selecting switch SW provides the zero internal clock signal to the secondary delay block 160, and the secondary delay time provided by the secondary delay block 160 is then applied to the first internal clock signal. Thus, only in circumstances where the secondary delay time is required is the secondary phase locking operation performed.

For example, it is now assumed that a "needed delay time" to be provided by the wideband DLL circuit 100 is 120 ns. Further, it is assumed that the total delay time capable of being provided by the primary delay block 120 is 100 ns. Therefore, there is a shortage of 20 ns in delay time through the completion of the primary phase locking operation. It is also assumed in this working example that the secondary delay block 160 provides a secondary delay time of 100 ns. Thus, once the necessity for the secondary phase locking operation is identified following provision of the maximum total delay time through the primary phase locking operation, the secondary phase locking operation is performed to provide the needed 20 ns, such that the internal clock signal becomes phase synchronous with the external clock signal.

As described above, the wideband DLL circuit 100 according to an embodiment of the inventive concept allows a relatively short unit delay time to be defined for the plurality of delay cells 121 through 125 forming the primary delay block 120 in order to efficiently and accurately phase lock an internal clock signal to a high frequency clock signal. Yet, the selective operation of the secondary delay block 160 also allows the wideband DLL 100 to phase lock an internal clock to a low frequency clock signal. The incorporation of the secondary delay block 160 also allows the number of the delay cells 121 through 125 to be reduced in the primary delay block 120. Thus, the collective delay cell load placed on the common node of the multiplexer(s) forming the switching block 130 may be reduced such that the wideband DLL circuit 100 is more suitable for high frequency applications.

Figure 2:
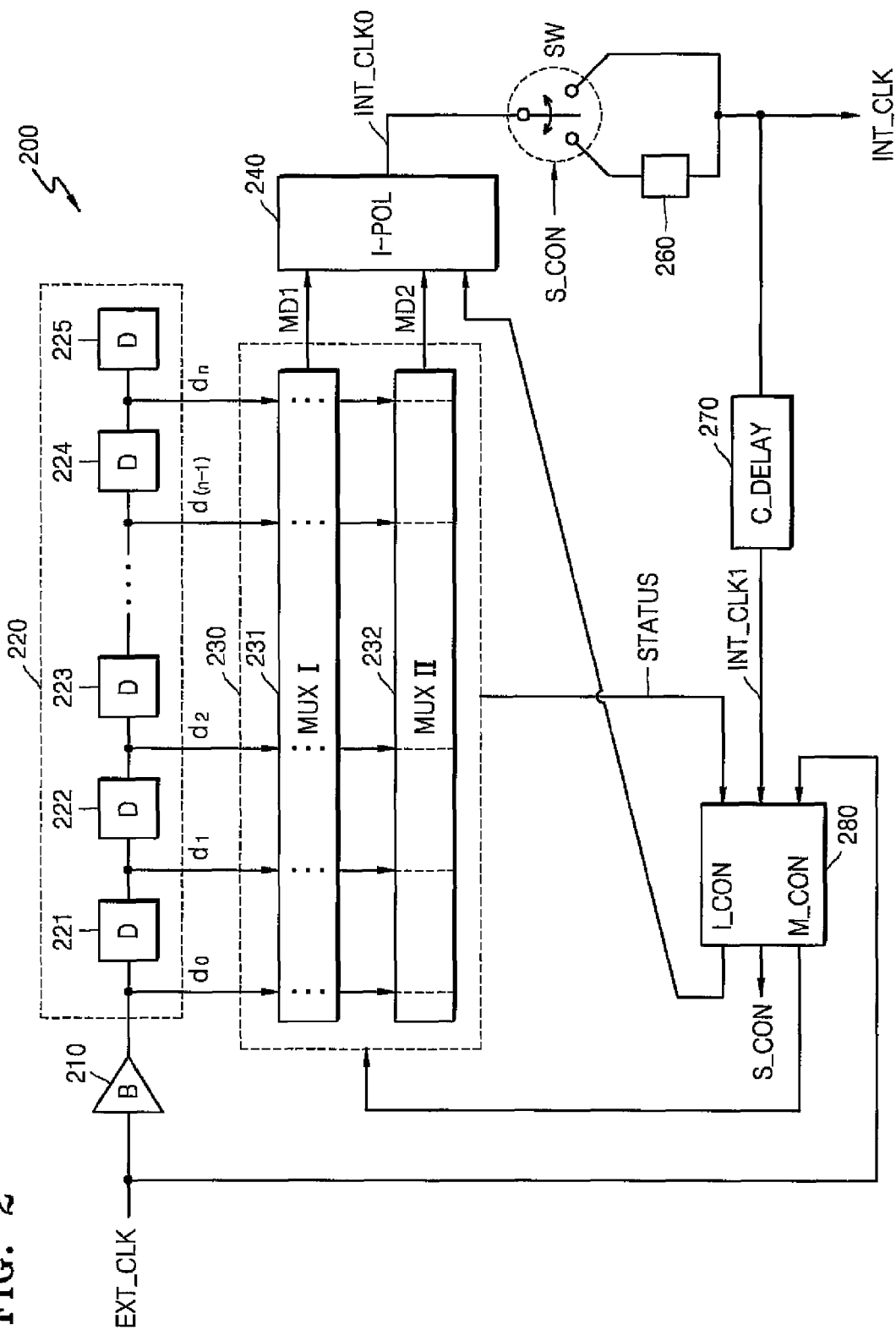
FIG. 2 is a diagram of a wideband DLL circuit according to another embodiment of the inventive concept.

FIG. 2 is a diagram of a wideband DLL circuit 200 according to another embodiment of the inventive concept.

The wideband DLL circuit 200 is essentially the same as the wideband DLL circuit 100 of FIG. 1, except that an analogous secondary delay control circuit is omitted. Other elements use an analogous "200" number instead of the previously used "100" numbers. That is, the wideband DLL 200 comprises; a buffer 210, a primary delay block 220, a switching block 230, an interpolator 240, a phase detection/control circuit 280, a secondary delay block 260, a clock path delay block 270, and a path selecting switch SW.

Thus, while the wideband DLL circuit 100 of FIG. 1 determines a switching status of the switching block 130 using the reset signal (RST), the wideband DLL circuit 200 of FIG. 2 determines a switching status of the switching block 230 by controlling the multi-switch control signal (M_CON). This difference allows the user several different options as between the illustrated embodiments, but the wideband DLL circuit 200 of FIG. 2 may be implemented in fewer functional blocks.

Of note the phase detection/control circuit 280 may be used to generate the path switch control signal (S_CON) in addition to the interpolation control signal (I_CON) and the multi-switch control signal (M_CON).

Except for these differences, the performance of the function blocks and the cooperative relationship between the function blocks of the wideband DLL circuit 200 of FIG. 2 are the same as those of the wideband DLL circuit 100 of FIG. 1, and a repetitious detailed description thereof will be omitted.

While the inventive concept has been particularly shown and described with reference to embodiments thereof, it will be understood that various changes in form and details may be made therein without departing from the scope of the following claims.

What is claimed is:

1. A wideband delay-locked loop (DLL) circuit, comprising:
    an internal clock signal generating unit comprising;
        a primary delay block receiving an external clock signal and comprising a plurality of series connected delays cells each respectively providing a clock delay signal, such that a plurality of clock delay signals ranging from a zero clock delay signal up through an Nth clock delay signal is provided, where "N" is a positive integer greater than 1,
        a switching block selecting two of the plurality of clock delay signals and providing the selected two clock delay signals as first and second switching clock signals, and
        an interpolator receiving and interpolating between the first and second switching clock signals to generate a zero internal clock signal;
    a path selecting switch receiving the internal clock signal and either (1) passing the zero internal clock signal to generate an internal clock signal or (2) applying the zero internal clock signal to a secondary delay block providing a secondary delay time to the zero internal clock signal to generate the internal clock signal;
    a clock path delay block receiving the internal clock signal and applying a clock path delay time to the internal clock signal to generate a first internal clock signal; and
    a phase detection/control circuit receiving and comparing a phase of the first internal clock signal with a phase of the external clock signal, and generating an interpolation control signal controlling the interpolator, a multi-switch control signal controlling the switching block, and a path switch control signal controlling the path selecting switch.

2. The wideband DLL circuit of claim 1, wherein the switching block provides a switch status signal to the phase detection/control circuit, wherein the switch status signal indicates the two of the plurality of clock delay signals currently selected by the switching block.

3. The wideband DLL circuit of claim 2, wherein in response to the switch status signal, the multi-switch control signal is modified to define a sequence of selection loops selecting different first and second switching clock signals.

4. The wideband DLL circuit of claim 2, wherein a first selection loop in the sequence of selection loops selects the zero clock delay signal and a first clock delay signal from the plurality of clock delay signals, wherein the first clock delay signal differs from the zero clock delay signal by a unit delay time, and
    a second selection loop following the first selection loop in the sequence of selection loops selects the first clock delay signal and a second clock delay signal from the plurality of clock delay signals, wherein the second clock delay signal differs from the first clock delay signal by the unit delay time.

5. The wideband DLL circuit of claim 1, wherein each one of the plurality of series connected delay cells progressively provides a defined unit delay time to the external clock signal.

6. The wideband DLL circuit of claim 1, wherein the switching block comprises first and second multiplexers respectively selecting the first and second switching clock signals in response to the multi-switch control signal.

7. The wideband DLL circuit of claim 6, wherein the first and second multiplexers are reset by a reset signal.

8. The wideband DLL circuit of claim 1, further comprising a buffer receiving the external clock signal and providing a buffered version of the external clock signal to the primary delay block.

9. A wideband delay-locked loop (DLL) circuit, comprising:
an internal clock signal generating unit comprising;
a primary delay block receiving an external clock signal and comprising a plurality of series connected delays cells each respectively providing a clock delay signal, such that a plurality of clock delay signals ranging from a zero clock delay signal up through an Nth clock delay signal is provided, where "N" is a positive integer greater than 1,
a switching block selecting two of the plurality of clock delay signals and providing the selected two clock delay signals as first and second switching clock signals, and
an interpolator receiving and interpolating between the first and second switching clock signals to generate a zero internal clock signal;
a path selecting switch receiving the internal clock signal and either (1) passing the zero internal clock signal to generate an internal clock signal or (2) applying the zero internal clock signal to a secondary delay block providing a secondary delay time to the zero internal clock signal to generate the internal clock signal;
a clock path delay block receiving the internal clock signal and applying a clock path delay time to the internal clock signal to generate a first internal clock signal;
a phase detection/control circuit receiving and comparing a phase of the first internal clock signal with a phase of the external clock signal, and generating an interpolation control signal controlling the interpolator, a multi-switch control signal controlling the switching block, and a reset control signal; and
a secondary delay block control circuit receiving the reset control signal and generating a reset signal and a path switch control signal controlling the path selecting switch.

10. The wideband DLL circuit of claim 9, wherein the switching block provides a switch status signal to the phase detection/control circuit, wherein the switch status signal indicates the two of the plurality of clock delay signals currently selected by the switching block.

11. The wideband DLL circuit of claim 10, wherein in response to the switch status signal, the multi-switch control signal is modified to define a sequence of selection loops selecting different first and second switching clock signals.

12. The wideband DLL circuit of claim 10, wherein a first selection loop in the sequence of selection loops selects the zero clock delay signal and a first clock delay signal from the plurality of clock delay signals, wherein the first clock delay signal differs from the zero clock delay signal by a unit delay time, and
a second selection loop following the first selection loop in the sequence of selection loops selects the first clock delay signal and a second clock delay signal from the plurality of clock delay signals, wherein the second clock delay signal differs from the first clock delay signal by the unit delay time.

13. The wideband DLL circuit of claim 9, wherein each one of the plurality of series connected delay cells progressively provides a defined unit delay time to the external clock signal.

14. The wideband DLL circuit of claim 9, wherein the switching block comprises first and second multiplexers respectively selecting the first and second switching clock signals in response to the multi-switch control signal.

15. The wideband DLL circuit of claim 14, wherein the first and second multiplexers are reset by a reset signal.

16. The wideband DLL circuit of claim 9, further comprising a buffer receiving the external clock signal and providing a buffered version of the external clock signal to the primary delay block.

* * * * *